(12) United States Patent
Nomura et al.

(10) Patent No.: US 10,525,664 B2
(45) Date of Patent: Jan. 7, 2020

(54) AIR-PERMEABLE SHEET

(71) Applicants: Japan Vilene Company, Ltd., Tokyo (JP); National Institute of Advanced Industrial Science and Technology, Tokyo (JP)

(72) Inventors: Kenichi Nomura, Ibaraki (JP); Hirobumi Ushijima, Ibaraki (JP); Kengo Noguchi, Ibaraki (JP); Noriko Michihata, Ibaraki (JP); Takeshi Kobayashi, Ibaraki (JP); Masaaki Kawabe, Ibaraki (JP)

(73) Assignees: JAPAN VILENE COMPANY, LTD., Tokyo (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 196 days.

(21) Appl. No.: 15/501,399

(22) PCT Filed: Apr. 17, 2015

(86) PCT No.: PCT/JP2015/061820
§ 371 (c)(1),
(2) Date: Feb. 2, 2017

(87) PCT Pub. No.: WO2016/021239
PCT Pub. Date: Feb. 11, 2016

(65) Prior Publication Data
US 2017/0232705 A1   Aug. 17, 2017

(30) Foreign Application Priority Data

Aug. 7, 2014   (JP) .................................. 2014-161716
Jan. 26, 2015   (JP) .................................. 2015-012792

(51) Int. Cl.
| | | |
|---|---|---|
| B32B 5/26 | (2006.01) | |
| B32B 5/02 | (2006.01) | |
| H01L 21/683 | (2006.01) | |
| H05K 3/12 | (2006.01) | |

(52) U.S. Cl.
CPC ............... *B32B 5/26* (2013.01); *B32B 5/022* (2013.01); *B32B 5/024* (2013.01); *B32B 5/026* (2013.01); *H01L 21/6838* (2013.01); *B32B 2250/02* (2013.01); *B32B 2250/20* (2013.01); *B32B 2262/02* (2013.01); *B32B 2262/0223* (2013.01); *B32B 2262/0246* (2013.01); *B32B 2262/0253* (2013.01); *B32B 2262/0284* (2013.01); *B32B 2262/103* (2013.01); *B32B 2307/724* (2013.01); *H05K 3/12* (2013.01); *H05K 2203/0165* (2013.01)

(58) Field of Classification Search
CPC ............ B32B 2250/02; B32B 2250/20; B32B 2262/02; B32B 2262/0223; B32B 2262/0246; B32B 2262/0253; B32B 2262/0284; B32B 2262/103; B32B 2307/724; B32B 5/022; B32B 5/024; B32B 5/026; B32B 5/26; H01L 21/6838; H05K 2203/0165; H05K 3/12
See application file for complete search history.

(56) References Cited

U.S. PATENT DOCUMENTS

| | | | |
|---|---|---|---|
| 9,707,504 B2 * | 7/2017 | Chaen ................... | B32B 27/322 |
| 2007/0190253 A1 | 8/2007 | Matsunaga et al. | |

FOREIGN PATENT DOCUMENTS

| | | | | |
|---|---|---|---|---|
| CN | 1468159 | A | 1/2004 | |
| CN | 103608912 | A | 2/2014 | |
| JP | 4507 | U | 1/1992 | |
| JP | 85782 | Y | 2/1996 | |
| JP | 09-057561 | A | 3/1997 | |
| JP | 2003291220 | A | 10/2003 | |
| JP | 2004-351413 | A | 12/2004 | |
| JP | 2009-117552 | A | 5/2009 | |
| JP | 2011-144480 | A | 7/2011 | |
| JP | 2012-061556 | A | 3/2012 | |
| JP | 2014-218054 | A | 11/2014 | |
| JP | 2015-080867 | A | 4/2015 | |
| WO | 0228577 | A2 | 4/2002 | |
| WO | WO-2013157647 | A1 * | 10/2013 | ........... B32B 27/322 |

OTHER PUBLICATIONS https://patents.google.com/patent/JP2015080867A/en?q=-patent%2fUS20170232705A1#similarDocuments (Year: 2013).*
International Search Report for PCT/JP2015/061820 dated Jul. 21, 2015, 2 pages.
JPH4-507, Microfilm of the specification and drawings annexed to the request of Japanese Utility Model Application No. 008394/1990 (Laid-open No. 000507/1992), Taiyo Yuden Co., Ltd., Jan. 6, 1992, 13 pages.

* cited by examiner

*Primary Examiner* — Arti Singh-Pandey
(74) *Attorney, Agent, or Firm* — Heslin Rothenberg Farley & Mesiti P.C.

(57) ABSTRACT

Provided is an air-permeable sheet (3) to be used in a state of being interposed between a suction stage (1) and an air-impermeable substrate (4) when printing is performed by a sheet-fed method on the surface of the substrate (4) fixed by suction to the suction stage (1), the air-permeable sheet capable of printing a desired printing pattern on the surface of the substrate with high accuracy. The air-permeable sheet (3) includes a non-woven fabric layer (3b) and a support layer (3a) constituted by a woven fabric or knitted fabric.

6 Claims, 4 Drawing Sheets

AIR-PERMEABLE SHEET

CROSS REFERENCE TO RELATED APPLICATIONS

This application is a national stage filing under section 371 of International Application No. PCT/JP2015/061820, filed on Apr. 17, 2015, and published in Japanese on Feb. 11, 2016, as WO 2016/021239 A1 and claims priority to Japanese Application Nos. 2014-161716, filed on Aug. 7, 2014 and 2015-012792, filed on Jan. 26, 2015. The entire disclosures of each of the prior applications are hereby incorporated herein by reference.

TECHNICAL FIELD

The present invention relates to an air-permeable sheet to be used in a state of being interposed between a suction stage of a vacuum suction apparatus and a substrate when printing is performed in Printed Electronics on the surface of the substrate fixed by suction to the suction stage, and particularly to an air-permeable sheet that can be suitably used when electronic components are formed by printing on the surface of an air-impermeable substrate such as a film.

BACKGROUND ART

With miniaturization of electric equipment, development of small and lightweight or thin electronic components such as integrated circuits, wiring materials, or electronic substrates (hereinafter, comprehensively referred to as electronic components in some cases) have been conducted. As techniques that meet to the demand, recently, attention has been drawn to Printed Electronics.

Printed Electronics is a technical field in which various inks blended with a conductive component, a semiconductor component, or the like (hereinafter, various inks to be used in Printed Electronics are simply referred to as inks in some cases) are printed on the surfaces of substrates such as films or fabrics (for example, non-woven fabrics, woven fabrics, or knitted fabrics) to form various electronic components on the surfaces of the substrates.

By using techniques relating to Printed Electronics, electronic components are formed on the surfaces of lightweight and thin substrates, such as films or fabrics, or flexible substrates so that small and lightweight or flexible electric equipment can be provided.

As a technique relating to Printed Electronics, JP 2009-117552 A (hereinafter, referred to as Patent Document 1) discloses a suction stage in which a case where a solar cell element is processed to a film substrate having a size of about 1 m square is illustrated as an example. This technique relates to a suction stage for fixing a substrate by suctioning air, and it is disclosed that the substrate is fixed by suction to a stage base in a state where a flat plate having a plurality of rough pores passing through a space between a front surface and a rear surface and a laminate of sheet members in which fine pores are formed, such as a non-woven fabric, are interposed therebetween.

In this technique of Patent Document 1, the sheet member, which is provided with the flat plate having rough pores passing through a space between a front surface and a rear surface by mechanically processing a non-porous metallic material through cutting or the like and in which fine pores having air permeability are formed on the surface to which the substrate is fixed by suction, is attached to the suction stage of a vacuum suction apparatus that performs suction fixation of the substrate (see FIG. 1 or the like of Patent Document 1). In this technique, a non-woven fabric formed from a fluorine resin or the like is disclosed as a preferred embodiment of a sheet member having fine pores.

As another background art, JP 2012-61556 A (hereinafter, referred to as Patent Document 2) proposes a suction plate made of a non-woven fabric which is used in a suction surface (a suction stage provided with an intake port) of a vacuum suction apparatus that conveys or fixes paper, a film, a wafer, a glass plate, a metallic plate, or the like by vacuum suction. In this technique of Patent Document 2, focus is put on the influence on the surface of an object to be suctioned, and thus a non-woven fabric suction plate made of a thermally adhesive non-woven fabric is disclosed which satisfies a predetermined air permeation volume as compared to a sponge with poor abrasion resistance, or a porous sheet, sintered metal, and porous ceramics which are generally poor in air permeability and are poor in adhesion force with the substrate. Specifically, the plate is produced in such a structure that a thermally adhesive non-woven fabric A containing low-melting-point fibers as main components (mass per unit area: 50 to 200 g/m$^2$, bulk density: 0.60 to 1.20 g/m$^3$) and a non-woven fabric B containing, as main components, fibers having a higher melting point than that of the low-melting-point fibers by 70° C. or higher (mass per unit area: 300 to 800 g/m$^2$, bulk density: 0.10 to 0.50 g/m$^3$) are laminated and then the outer circumference of this laminate is fused by heat pressing. When the air permeation volume of the non-fused portion of this plate is adjusted to 50 to 150 cc/cm$^2$/sec and the air permeation volume of the fused portion is adjusted to 5 cc/cm$^2$/sec, the fused portion provided at the outer circumference facilitates the installation to the vacuum suction apparatus and a decrease in suction force caused by leakage of air from a portion other than the non-fused portion may be prevented. It is described that, with such a configuration, a suction plate can be provided in which evaluation is conducted using the air permeation volume and flatness determined by visual inspection or the like as indices, and which enables a workpiece to be strongly gripped and fixed and move and is applicable to a suction surface of the vacuum suction apparatus such as a hand portion of a robot.

Further, in the technique of Patent Document 2, a thermally adhesive fiber is used in each non-woven fabric. For this reason, as a preferred embodiment of the non-woven fabric A coming into contact with the workpiece, the non-woven fabric A is configured by fibers on which interlacing and heat treatment can be performed after carding, and there is disclosed a modified polyester fiber, a modified nylon fiber, a polyolefin fiber having a core-in-sheath structure of polyethylene, polypropylene, or the like or in which a half of the fiber cross-section is polypropylene, or a composite fiber having a core-in-sheath structure of polyester/nylon or the like or a two-component fiber in which one half of the fiber cross-section is polypropylene and the other half is polyethylene. It is described that, in consideration of carding machine processability, the fibers to be used have a fineness of 1 to 70 dtex and a fiber length of 1 to 100 mm and a thermally adhesive component, which attaches fibers, of a low-melting-point fiber is preferably in a melting point range of 10 to 200° C.

These techniques of two documents are referred to as a so-called sheet-fed method, and printing is performed on one substrate. Meanwhile, JP 2004-351413 A (Patent Document 3) relates to a method of applying and drying a liquid and discloses a technique of suctioning an object on a porous circulating member such as a screen belt or a screen drum through vacuuming and applying a liquid on the object to dry the liquid at least to the touch. This technique discloses as follows. A liquid is applied on a surface of an object suctioned and stably held on a circulating member, by which the object moves together with the circulating member without deforming. In addition, heat is transferred through the circulating member, which prevents the surface from skinning as is the case with a hot air furnace. Further, since a ununiformity of temperature control caused by heating technique is less likely to be affected, a high-quality coating film and a product thereof can be provided. Moreover, it is disclosed that a screen belt or screen drum of 40 mesh or more (hereinafter, comprehensively referred to as a screen drum in this application) can be used as an embodiment of the circulating member, and as necessary, air-permeability natural or fossil woven fabric or non-woven fabric, Japanese paper, synthetic paper, a plastic film, or the like may be supplied thereon in an underlying web of a single layer form or a multi-layer form to suction the object. It is described that the underlying web is used for preventing the surface of the circulating member from contamination and allowing recovery of the scattered liquid (printing material). As another effect of the document, it is mentioned to indirectly processing for the object, so that the problem on a small gap at the seam portion of the screen belt or drum can be solved.

As understood from the background arts of the aforementioned Patent Document 1 and Patent Document 2, the vacuum suction apparatus has been widely used for fixing and conveying the workpiece. Particularly, for forming an electronic component or the like to a substrate used in the field of Printed Electronics (hereinafter, in the present application, a film with substantially no air permeability is comprehensively referred to as an "air-impermeable substrate"), the suction stage surface, which forms the contact face with the substrate, of the vacuum suction apparatus is demanded to have flatness of a surface to be printed with extremely high accuracy in printing of an ink as well as to enable immobilization of the air-impermeable substrate. As such an air-impermeable substrate, a polyimide film or polyester film having a thickness of about 50 µm is currently being put to practical use. However, as the thinning is being advanced, and as also disclosed in the aforementioned Patent Document 1, according to an increase in size of a film substrate itself to be fixed, it is difficult to maintain the flatness of the film itself in a state of being suctioned by the suction stage. Thus, highly accurate flatness is also demanded for an air-permeable sheet, which is interposed between the suction stage and the substrate, at the time of printing.

CITATION LIST

Patent Document

Patent Document 1: JP 2009-117552 A (Claims, [0001], [0008], FIG. 1, and the like)
Patent Document 2: JP 2012-61556 A (Claims, [0005], [0009], [0013] to [0016], to [0033], and [FIG. 1] to [FIG. 3])
Patent Document 3: JP 2004-351413 A (Claims, [0001], [0010] to [0013], [0041] to [0044], [0058], and the like)

SUMMARY OF THE INVENTION

Problem to be Solved by the Invention

Under these circumstances, the inventors of the present application conducted various studies on high accuracy of a printing pattern obtainable by using a non-woven fabric as an air-permeable sheet to be interposed between a suction stage of a vacuum suction apparatus, which is used in Printed Electronics of a sheet-fed method, and a substrate. According to the studies of the inventors of the present application, when an air-permeable sheet formed only from a non-woven fabric is disposed directly on a non-porous suction stage to fix a film substrate by suction as in Patent Document 1 and Patent Document 2, in order to prevent the shape of the suction port from being printed on the surface of the film substrate, it is necessary to disperse suction pressure vertically generated from a suction port and to adjust the thickness of the non-woven fabric to several mm or more. For these reasons, in the configuration in which only such a thick non-woven fabric is interposed between the suction stage and the film substrate, productivity is poor and a cost may increase, which is not practical. Moreover, in order to make the printing pattern clear, flatness of the surface of the non-woven fabric to be used, that is, flatness of the surface coming contact with the film substrate is important. Therefore, in the case of using a dry-type non-woven fabric having a relatively large fineness as in Patent Document 2, unevenness of fibers is transferred onto the film substrate and thus clear printing is difficult to perform.

Further, in the case of the aforementioned sheet-fed method, printing is performed in a state where a larger film substrate than an air-permeable sheet placed on a suction stage is overlapped on the air-permeable sheet and the suction stage, the air-permeable sheet, and the film substrate are in close contact with one another by the action of a suction port of the suction stage that comes into direct contact with the film substrate. For this reason, when positioning of the film substrate is performed on the air-permeable sheet before printing or the film substrate is removed after printing, frictional electrostatic charging or peeling electrostatic charging (hereinafter, comprehensively referred to as electrostatic charging in some cases) between the film substrate and the air-permeable sheet tends to occur. In general, the prevention of electrostatic charging is difficult to achieve for a film substrate expected to have insulating property. As a result, as the mechanical strength decreases when the thickness of the film substrate decreases, there is a problem in that wrinkles tend to be generated at the time of removing or damages tend to occur.

Furthermore, in the technique described in Patent Document 3, there is also disclosure ([0013]) that the object fixed by suction on the surface of the circulating member is temporally stopped and a coating device such as a spray gun may be intermittently moved. However, for example, in the case of the multi-layer wiring, it is necessary to perform the printing process in plural times and to conduct highly accurate positioning. For these reasons, many problems still remain in realizing the same accuracy as in the Printed Electronics of the sheet-fed method in a continuous processing technique. Therefore, specific fiber diameter configuration of the "underlying web" described in this technique and the effect verification are also not disclosed, and similarly to Patent Document 1 and Patent Document 2, there is a problem in that it is difficult to realize clear printing on the air-impermeable substrate in which thinning is being advanced.

The present invention is made in view of the aforementioned problems of the background arts, and an object thereof is to provide an air-permeable sheet to be used in a state of being interposed between a suction stage of a vacuum suction apparatus and a substrate when printing is performed on the surface of the substrate fixed by suction to the suction stage, the air-permeable sheet capable of printing a desired printing pattern with high accuracy on the surface of the substrate and having excellent handling ability of a film substrate by suppression of electrostatic charging.

Means for Solving Problem

In order to achieve the object, an air-permeable sheet of the present invention is an air-permeable sheet to be used in a state of being interposed between a flat suction stage and an air-impermeable substrate when printing is performed on the surface of the air-impermeable substrate fixed by suction onto the suction stage, the air-permeable sheet including a non-woven fabric layer being in contact with the air-impermeable substrate; and a support layer being in contact with the suction stage and formed from a woven fabric or knitted fabric.

Further, it is preferable that the support layer has an interval of openings of 70 to 400 mesh.

Furthermore, it is preferable that the non-woven fabric layer being in contact with the air-impermeable substrate be mainly formed from constituent fibers having a fiber diameter of 10.5 μm or less. Incidentally, the constituent fibers having a predetermined fiber diameter or less described herein are constituent components being in direct contact with the air-impermeable substrate, and "mainly formed" preferably means that the constituent fibers of the non-woven fabric layer satisfy substantially all conditions of the fiber diameter.

The thickness of the non-woven fabric layer described in the present invention is a value measured by a measurement instrument to be described later in unit of mm, and the interval of the openings is consistent with a nominal value in unit of mm, which can be specified from a wire diameter and the mesh number, and can be calculated by a calculation formula to be described later.

Effect of the Invention

By using the air-permeable sheet with the aforementioned configuration when Printed Electronics of a sheet-fed method is performed, it is possible to print a highly accurate pattern on the air-impermeable substrate such as a film substantially without influence of a size of a suction port of the suction stage, the number of the suction ports, and the arrangement of the suction port, and to provide excellent electronic component with high reproducibility.

MODE(S) FOR CARRYING OUT THE INVENTION

Similarly to a conventionally known technique of Printed Electronics, while an air-permeable sheet of the present invention is disposed on a suction stage embedded in a vacuum suction apparatus, an air-impermeable substrate of a film or the like which is in contact with the sheet is placed thereon, and then the apparatus is operated to perform printing. Hereinafter, description will be made using FIG. 1 which is a schematic cross-sectional view when the air-permeable sheet of the present invention is used. An air-permeable sheet (3) of the present invention includes at least one non-woven fabric layer (3b) and at least one support layer (3a), and as necessary, can further include another air-permeable member. The air-permeable sheet is configured by laminating these members. The air-permeable sheet (3) is used in a state where the support layer (3a) is in contact with a suction stage (1) provided with a suction port (2), and the vacuum suction apparatus is operated in a state where an air-impermeable substrate (4) is disposed to be in contact with the non-woven fabric layer (3b) so as to fix the substrate thereto. At this time, another air-permeable material may be interposed between the layers of the air-permeable sheet (3), but it is necessary to provide the support layer (3a) at the suction stage (1) side of the non-woven fabric layer (3b). That is, as the function effect of the air-permeable sheet (1) of the present invention, when air between the air-impermeable substrate (4) and the suction stage (1) is suctioned from the suction port (2), localization of suction force caused by the pattern of the suction port (2) is first alleviated by the support layer (3a) of the air-permeable sheet (3) interposed between the air-impermeable substrate and the suction stage. Then, printing may be performed with high accuracy by an ink applying member (5) in a state where suction force, which penetrates through the support layer (3a), at the apparatus side is further dispersed via the non-woven fabric layer (3b), and the air-impermeable substrate (4) that is an object directly applied with the suction force is pulled toward the suction stage (1) so that flatness of the substrate (4) is maintained. During performing this printing, the influence of conditions of the apparatus such as a pattern interval of the suction port of the vacuum suction apparatus is further alleviated by making fibers constituting the non-woven fabric layer (3b) have a smaller fiber diameter than an opening (not illustrated) of a woven fabric or knitted fabric. Further, the "air-impermeable substrate" described in the present application enables a clear ink pattern to be formed, for example, even when a multi-layer wiring (via hole or contact hole) is formed over front and rear surfaces of a film having an extremely fine opening, as long as the air-impermeable substrate can be fixed to the vacuum suction apparatus.

Figure 1:
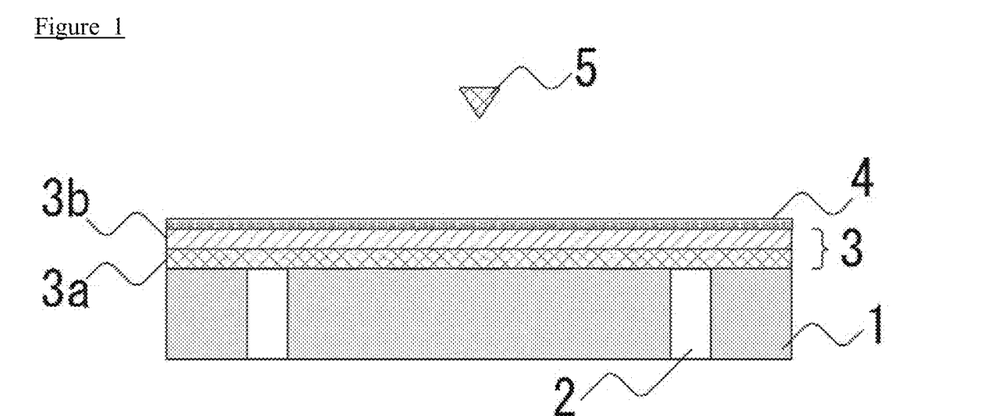
FIG. 1 is a schematic cross-sectional view of an air-permeable sheet of the present invention at the time of use.

In addition, the woven fabric or knitted fabric constituting the support layer (3a) of the air-permeable sheet also has air permeability in a thickness direction and a direction orthogonal to the thickness direction. For this reason, the suction force by the suction stage can be dispersed in various directions inside the volume of the support layer. Therefore, as the constituent material of the woven fabric or knitted fabric serving as the support layer, various synthetic resins or metals may be selected, but a metallic mesh that may maintain a relatively robust structure when suction force acts is preferably employed, and particularly, a stainless steel (SUS) material with excellent antirust property and stiffness is most preferable. That is, in the Printed Electronics, in order to clearly print a pattern to be printed, the diameter of the suction port of the suction stage is decreased so that the deformation of the air-impermeable substrate just above the suction port is suppressed. However, when the diameter of the suction port is decreased, as also disclosed in the aforementioned Patent Document 1, the processing cost of the suction stage itself is increased so that the suction efficiency of the air-impermeable substrate tends to decrease. The air-permeable sheet to which the present invention is applied can disperse the suction force by the suction stage in various directions in the volume of the support layer, a decrease in suction force can be suppressed by the wide surface area of the non-woven fabric layer, and a flat surface can be provided to the air-impermeable substrate. Therefore, by simply disposing the air-permeable sheet on a suction stage of a general vacuum suction apparatus, significant cost reduction and improvement in working efficiency may be achieved.

A preferred woven fabric or knitted fabric as the configuration of the support layer (3a) described above may be selected from plain weave, twilled weave, plain dutch weave, and the like, but plain weave whose cost is relatively low and structure is simple is preferably selected. In particular, in consideration of the fiber diameter of constituent fibers of the non-woven fabric layer (3b) to be described later, 70 to 400 mesh is preferable and 100 to 400 mesh is more preferable in terms of the plain weave. That is, in an embodiment in which the support layer (3a) is formed from SUS, when the opening is adjusted to be smaller than 70 mesh having an interval of openings of about 0.2 mm (wire diameter: 0.15 mm), the bending rigidity of the entire air-permeable sheet is ensured, the unevenness of the knitted weaving structure of the support layer (3b) itself is alleviated by the constituent fibers of the non-woven fabric layer (3b), and a flat surface can be provided to the air-impermeable substrate (4) fixed by suction. In addition, in the case of the support layer (3a) having a smaller opening than 400 mesh having an interval of openings of about 0.034 mm square (wire diameter: 0.028 mm), the layer itself has flexibility; however, the effect caused by the lamination of the support layer and the non-woven fabric layer is extremely small and the rigidity of the support layer itself is not sufficient. For these reasons, the sheet is difficult to handle, and for example, when the sheet is bended, deformation such as local bulge occurs so that printing is difficult to perform.

Further, fibers used in the non-woven fabric layer (3b) constituting the air-permeable sheet of the present invention are not particularly limited, but specifically, the non-woven fabric layer is preferably constituted by fibers formed from a synthetic resin such as a polyolefin-based resin (for example, a polyolefin-based resin having a structure in which a part of polyethylene, polypropylene, polymethylpentene, or hydrocarbon is substituted with a cyano group or halogen such as fluorine or chlorine), a styrene-based resin, a polyether-based resin (for example, polyether ether ketone, polyacetal, a phenolic resin, a melamine-based resin, a urea-based resin, an epoxy-based resin, modified polyphenylene ether, or aromatic polyether ketone), a polyester-based resin (for example, polyethylene terephthalate, polytrimethylene terephthalate, polybutylene terephthalate, polyethylene naphthalate, polybutylene naphthalate, polycarbonate, polyarylate, a whole aromatic polyester resin, or an unsaturated polyester resin), a polyimide-based resin, a polyamide-imide resin, a polyamide-based resin (for example, an aromatic polyamide resin, an aromatic polyether amide resin, or a nylon resin), a resin having a nitrile group (for example, polyacrylonitrile), a urethane-based resin, an epoxy-based resin, a polysulfone-based resin (for example, polysulfone or polyethersulfone), a fluorine-based resin (for example, polytetrafluoroethylene or polyvinylidene fluoride), a cellulose-based resin, a polybenzimidazole resin, an acrylic resin (for example, a polyacrylonitrile-based resin obtained by copolymerization of acrylic acid ester, methacrylic acid ester, or the like, or a modacrylic resin obtained by copolymerization of acrylonitrile with vinyl chloride or vinylidene chloride), a vinylon-based resin (for example, vinyl acetate or polyvinyl alcohol), or a conductive polymer (for example, polypyrrole-based, polyaniline-based, polyacetylene-based, or polythiophene-based). These constituent fibers may be configured by one or plural types of resin components and are generally called composite fibers. For example, core-in-sheath, sea-island, side-by-side, or orange type composite fibers can be used.

In order to prepare the fibers constituting the sheet-shaped non-woven fabric layer (3b) to have a small fiber diameter, for example, a known technique such as a melt spinning method, a dry spinning method, a wet spinning method, a direct spinning method (for example, a melt-blowing method, a spun-bond method, or an electrostatic spinning method), a method of suctioning one or more types of resin components from composite fibers to remove fibers having a small fiber diameter, or a method of beating fibers to obtain divided fibers can be employed. Among these known method for producing a non-woven fabric, from the viewpoint of preventing dust from being generated from the air-permeable sheet (3) and preventing fluff on the surface of the non-woven fabric layer (3b) at the side of the air-impermeable substrate (4), long fibers obtainable by the aforementioned direct spinning are preferable.

Further, by adjusting the fiber diameter of the constituent fibers of the non-woven fabric layer (3b), the number of fibers per unit area in the contact plane with the air-impermeable substrate (4) increases if the mass per unit area of the non-woven fabric layer is approximately the same, and thus the surface flatness of the non-woven fabric layer is improved. Accordingly, the air-impermeable substrate (4) can be more evenly fixed when the air-impermeable substrate (4) is fixed by suction. For this reason, the fiber diameter of the non-woven fabric layer (3b) is preferably 10.5 µm or less and more preferably 1 µm or less. The air-impermeable sheet of the present invention is not limited to a case where a single non-woven fabric layer is provided, but when a plurality of non-woven fabric layers are provided, a layer mainly formed by the aforementioned constituent fibers with a fiber diameter of 10.5 µm or less preferably serves as a constituent component coming into direct contact with the air-impermeable substrate. In this case, since the non-woven fabric layer configured by synthetic fibers having a relatively small diameter tends to be easily electrostatically charged between the film substrate and the non-woven fabric layer by suction or the like of the vacuum apparatus, it is preferable to blend conductive fibers for preventing electrostatic charging with the non-woven fabric layer (3b). Instead of blending the conductive fibers, various embodiments can be employed, for example, a surfactant is added by applying the surfactant to the surface of the non-woven fabric layer (3b). At this time, the final amount of the surfactant applied to the non-woven fabric layer can be arbitrarily and appropriately designed depending on the type of surfactant to be used.

It is preferable that the non-woven fabric layer and the support layer of the air-permeable sheet and, if the non-woven fabric layer include a plurality of non-woven fabrics, these constituent components be overlapped and then are integrated by "Reliant Pressing Machine" (ASAHI CORPORATION: product name) which can perform thermal pressing between endless belts so that the handling ability of the air-permeable sheet is enhanced. In addition, adhesion can be performed by applying an adhesive to the layers between the non-woven fabrics instead of thermal pressing.

EXAMPLES

Hereinafter, various air-permeable sheets including preferred embodiments of the present invention (hereinafter, comprehensively referred to as evaluation samples) are prepared as Examples of the present invention, and evaluation results are described. However, the present invention is not limited only to the following Examples, and shapes, arrangement relations, numerical conditions, and the like may be designed arbitrarily and appropriately within the scope of the object of the invention. First, preparation of various non-woven fabrics that serve as non-woven fabric layers as Examples will be described.

(Preparation Method of Non-Woven Fabric A)

A non-woven fabric layer was prepared by a known electrostatic spinning technique as the preparation method of a non-woven fabric A. First, "Vonnel D122" (manufactured by Mitsubishi Rayon Co., Ltd.: product name) that is polyacrylonitrile having a weight average molecular weight of 200,000 was dissolved in N,N-dimethylformamide to have a concentration of 16 wt %, thereby obtaining a polymer solution (viscosity: 2000 mPa·s). Then, a metallic nozzle having an inner diameter of 0.41 mm and capable of discharging the polymer solution was disposed in a space (length: 1000 mm, width: 1000 mm, height: 1000 mm) surrounded by a case in a state where the metallic nozzle was connected to a DC high voltage generator, and an endless belt for collecting the discharged polymer solution was grounded and then disposed in the case. By applying a voltage of 17 kV to the metallic nozzle, the polymer solution was discharged at a speed of 3 g/h to be formed into fibers, thereby obtaining a non-woven fabric having a mass per unit area and thickness to be specifically described later. Herein, regarding the thickness of the constituent component of each evaluation sample, measurement when a load is 500 g was performed on five points by "Digimatic Standard Outside Micrometer MDC-MJ/PJ 1/1000 mm" (manufacture by Mitutoyo Corporation: product name) and then the measured values were recorded as an arithmetic mean value. When the average fiber diameter of the constituent fibers that are the main components of the non-woven fabric obtained in this way (hereinafter, comprehensively referred to as a non-woven fabric A) is measured by an electron microscope, the average fiber diameter was 0.4 µm (400 nm). By overlapping a plurality of the non-woven fabrics A when lamination with the support layer to be described later is performed, the non-woven fabrics A constitute non-woven fabric layers each having a different mass per unit area and thickness and the non-woven fabric layers were used as evaluation samples. Details thereof will be described in Table 1 to be described below along with the evaluation results of the evaluation samples provided with other non-woven fabrics.

(Preparation Method of Non-Woven Fabric B)

Then, in order to apply the same electrostatic spinning technique as in the non-woven fabric A, polyvinyl alcohol (manufactured by Wako Pure Chemical Industries, Ltd., completely saponified product with a polymerization degree of 1000) instead of polyacrylonitrile was dissolved in pure water to have a concentration of 12 wt %, an insolubilized solution in which a maleic anhydride copolymer "GANTREZ AN-119" (manufactured by Ashland Inc.: product name) is dissolved in water in advance to have a concentration of 12 wt % was added thereto, and these two solutions were mixed to have a solid content weight ratio of 4/1, thereby obtaining a polymer solution having a ratio of polyvinyl alcohol:maleic anhydride copolymer=1 mol:0.07 mol. This polymer solution (viscosity: 300 mPa·s) was used, and by applying a voltage of 22 kV to a metallic nozzle having an inner diameter of 0.33 mm in the same method as described above, the polymer solution was discharged at a speed of 0.5 g/h to be formed into fibers and then heat treatment with an oven set at 160° C. for 30 minutes was performed, thereby obtaining an insolubilized non-woven fabric B. From the observation with an electron microscope, the fiber diameter of the non-woven fabric B was 0.1 µm (100 nm). Incidentally, regarding conditions for measuring thickness and the like, the same method as in the non-woven fabric A was employed.

(Preparation Method of Non-Woven Fabric C)

As a non-woven fabric C, a commercially available polyethersulfone "SUMIKAEXCEL 5200P" (manufactured by Sumitomo Chemical Co., Ltd., product name) was dissolved in dimethylacetamide to have a concentration of 25 wt %, and a voltage of 22 kV was applied to a metallic nozzle having an inner diameter of 0.33 mm so that this polymer solution (viscosity: 1500 mPa·s) was discharged at a rate of 1 g/h to be formed into fibers. The fiber diameter of the obtained non-woven fabric C was 1 µm (1000 nm). Incidentally, regarding conditions for measuring thickness and the like, the same method as in the non-woven fabric A was employed.

(Preparation Method of Non-Woven Fabric D)

Then, as a preparation method of a non-woven fabric D, a non-woven fabric layer was prepared by a wet technique. A commercially available core-in-sheath composite fiber (core component: a polypropylene resin (melting point: 160° C.), sheath component: a high-density polyethylene resin (melting point: 120° C.), apparent fineness: 0.8 dtex [fiber diameter: 10.5 µm], fiber length: 5 mm) and an ultrafine fiber (component: a polypropylene resin (melting point: 160° C.), fiber diameter: 2 µm, fiber length: 3 mm) were used to form a slurry at a mass ratio of the core-in-sheath composite fiber:the ultrafine fiber=80 wt %:20 wt %. Thereafter, papermaking was conducted by an oblique rack net method, drying was performed by a hot air dryer set at a temperature of 140° C., and then the thickness was adjusted by a thermal calender roll to thereby obtain a wet non-woven fabric in which fibers are fused by the high-density polyethylene resin component. Incidentally, regarding conditions for measuring thickness and the like, the same method as in the non-woven fabric A was employed.

(Preparation Method of Non-Woven Fabric E)

Subsequently, the commercially available core-in-sheath composite fiber (core component: a polypropylene resin (melting point: 160° C.), sheath component: a high-density polyethylene resin (melting point: 120° C.), apparent fineness: 0.8 dtex [fiber diameter: 10.5 µm], fiber length: 5 mm) used in the non-woven fabric D and another core-in-sheath composite fiber (core component: a polypropylene resin (melting point: 160° C.), sheath component: a high-density polyethylene resin (melting point: 120° C.), apparent fineness: 1.7 dtex [fiber diameter: 15.3 μm], fiber length: 5 mm) were used to form wet paper at a mass ratio of the core-in-sheath composite fiber:another core-in-sheath composite fiber=20 wt %:80 wt %, thereby preparing a non-woven fabric E. Incidentally, regarding conditions for measuring thickness and the like, the same method as in the non-woven fabric A was employed.

(Preparation Method of Non-Woven Fabric F)

Then, as a non-woven fabric F, a non-woven fabric was prepared by a known dry technique. A commercially available first short fiber (component: a polyethylene terephthalate resin (melting point: 260° C.), fineness: 5.6 dtex [fiber diameter: 23 μm], fiber length: 38 mm) and a commercially available second short fiber (component: a polyethylene terephthalate resin (melting point: 260° C.), fineness: 1.25 dtex [fiber diameter: 11 μm], fiber length: 38 mm) were fiber-blended at a ratio of the first short fiber:the second short fiber=40 wt %:60 wt % to be formed into a web by a carding machine, and then the thickness was adjusted by a calender provided with a flat roll to thereby obtain a dry non-woven fabric F in which polyethylene terephthalate fibers are fused. Incidentally, regarding conditions for measuring thickness and the like, the same method as in the non-woven fabric A was employed.

(Support Layer)

As a support layer, four types of metallic mesh made of stainless steel described below (all manufactured by Kansai Wire Netting Co., Ltd.) were prepared.

70 mesh: plain weave, wire diameter: 0.15 mm, interval of openings: 0.20 mm 100 mesh: plain weave, wire diameter: 0.10 mm, interval of openings: 0.15 mm 200 mesh: plain weave, wire diameter: 0.050 mm, interval of openings: 0.077 mm 400 mesh: plain weave, wire diameter: 0.028 mm, interval of openings: 0.034 mm The interval of the openings described herein is a nominal value corresponding to the length of one side of mesh-shaped opening to be formed by wires in the plain weave, and generally can be calculated by the mesh number and the wire diameter d in unit of mm through the following formula. This calculation formula is a well-known calculation method, and it was confirmed that there is an extremely high correlation with the result obtained by actual observation with a microscope.

$$\text{Interval of openings} = (25.4/\text{the mesh number}) - \text{wire diameter } d$$

(Preparation of Air-Permeable Sheet for Evaluation)

An air-permeable sheet of each of Examples and Comparative Examples was prepared by combining each of the aforementioned non-woven fabrics and the support layer. An evaluation sample configured only by a metallic mesh without providing the non-woven fabric layer was prepared as Reference Example 1, an evaluation sample configured only by the non-woven fabric without providing the support layer was prepared as Reference Example 2, and an evaluation sample inversely using the front and rear surfaces of the air-permeable sheet of Example 2 was prepared as Reference Example 3.

(Evaluation of Printing on Air-Impermeable Substrate Using Each Evaluation Sample)

A commercially available polyethylene terephthalate film "Tetoron Film NS" (manufactured by Teijin DuPont Films Japan Limited: product name, thickness: 12 μm) serving as an air-impermeable substrate was cut into a square with one side of 160 mm and prepared, and then the each evaluation sample was covered with the air-impermeable substrate. As a commercially available vacuum suction apparatus, a rectangular flat-plate suction stage in which total 64 cylindrical suction ports having a diameter of 1.5 mm were formed in a reticular pattern with intervals of 20 mm (8 in a column, 8 in a row), and which has one side in the opening region of 140 mm was attached to the vacuum suction apparatus. Each evaluation sample was disposed to cover the entire opening region of the suction stage, four sides were taped to prevent loss of the suction force, and the air-impermeable substrate was setting on the taped sample. In this state, a vacuum pump of the vacuum suction apparatus was operated. The vacuum suction pressures at this time were standardized in a range of −40 to −48 kPa.

Further, as a screen mask serving as the printing pattern for evaluation, a plate in which a plurality of rectangular patterns (0.3 mm×1 mm) were formed with intervals of 0.2 mm in a region of 78 mm square at the mesh screen center portion (320 mm×320 mm) was used. An ink "HIMEC X7109" (manufactured by NAMICS Corporation: product name) containing a conductive component was applied to the screen mask and printing was performed by a plate-shaped squeegee so that the ink was transferred to the surface of the air-impermeable substrate. Incidentally, at this time, clearances (distances between the screen mask and the surface of the air-impermeable substrate in a state where the air-impermeable substrate is fixed by suction and the squeegee is not operated) were standardized to 1.5 mm. When the ink is printed on the substrate by using the screen mask, printing was performed such that the direction in which the squeegee of a screen printer slides and the longitudinal direction of the portion, to which the ink is applied, of the screen mask were parallel to each other.

Printing was performed using each evaluation sample by such a means, and the obtained ink pattern was identified and observed by an optical microscope "MZ125" (manufactured by Leica Camera AG: product name) with a magnification of 1.6. As a result, printing accuracy is finely classified into five shown in FIG. 2 to FIG. 7, and then evaluation was conducted based on three levels. A case where the ink pattern can be identified is designated as "◯," a case where the ink pattern cannot be identified is designated as "X," and a case where the ink pattern can be identified but is not appropriate is designated as "Δ." That is, the levels are as follows.

"◯": Based on observation with the microscope, the ink pattern is clearly printed.

"Δ (reticulation)": Based on observation with the microscope, the ink pattern is regularly distorted along the reticulation of the used mesh and the width of the pattern is not uniform.

"Δ (distortion)": Based on observation with the microscope, there is irregular distortion of the ink pattern that is considered to be generated by the constituent fibers of the non-woven fabric layer and the wire width is not uniform.

"Δ (suction port)": Based on observation with the microscope, the ink pattern is almost clearly printed, but an abnormal width of the pattern is recognized only at a position corresponding to the suction port.

"X": Based on observation with the microscope, the ink pattern overlaps neighboring pattern and the width of the pattern cannot be identified.

The results thereof are described in the following Table 1.

TABLE 1

| | Support layer (mesh) | Constitution of nonwoven fabric layer (mass per unit area) | Fiber diameter of nonwoven fabric layer (μm) | Opening of metallic mesh (mm) | Thickness of nonwoven fabric layer (mm) | Evaluation results |
|---|---|---|---|---|---|---|
| Example 1 | 70 | Nonwoven fabric A (50 g/m$^2$) | 0.4 | 0.213 | 0.300 | ○ |
| Example 2 | 100 | | | 0.154 | | |
| Example 3 | 200 | | | 0.077 | | |
| Example 4 | 400 | | | 0.034 | | |
| Example 5 | 400 | Nonwoven fabric A (5 g/m$^2$) | | 0.034 | 0.024 | |
| Example 6 | 100 | Nonwoven fabric A (17 g/m$^2$) | | 0.154 | 0.100 | |
| Example 7 | | Nonwoven fabric B (17 g/m$^2$) | 0.1 | | 0.090 | |
| Example 8 | | Nonwoven fabric C (17 g/m$^2$) | 1.0 | | 0.085 | |
| Example 9 | | Nonwoven fabric D (45 g/m$^2$) | 10.5 | | 0.107 | |
| Example 10 | 200 | | | 0.077 | | |
| Example 11 (*1) | | Nonwoven fabric F (60 g/m$^2$) + Nonwoven fabric A (17 g/m$^2$) | 0.4 | | 0.190 | |
| Comp. Example 1 | | Nonwoven fabric E (60 g/m$^2$) | 15.3 | | 0.252 | Δ(d) |
| Comp. Example 2 | | Nonwoven fabric F (60 g/m$^2$) | 23.4 | | 0.090 | Δ(d) |
| Reference Example 1 (*2) | | — | — | | — | Δ(r) |
| Reference Example 2 | — | Nonwoven fabric A (50 g/m$^2$) | 0.4 | — | 0.300 | Δ(s) |
| Reference Example 3 (*3) | Nonwoven fabric A (50 g/m$^2$) | 100 mesh | 0.4 | 0.154 | 0.220 | x |

(*1) Example 11 indicates that the support layer, nonwoven fabric F, and nonwoven fabric A were laminated in this order.
(*2) Reference Example 1 indicates the results of printing by the support layer alone.
(*3) Reference Example 3 indicates the results of printing in a state where the constitution is the same as that of Example 2, and the nonwoven fabric layer was brought into contact with the suction stage, and the support layer was brought into contact with the air-impermeable substrate.
Δ(r): Δ(reticulation)
Δ(d): Δ(distortion)
Δ(s): Δ(suction port)

(Evaluation Result)

Figure 2:
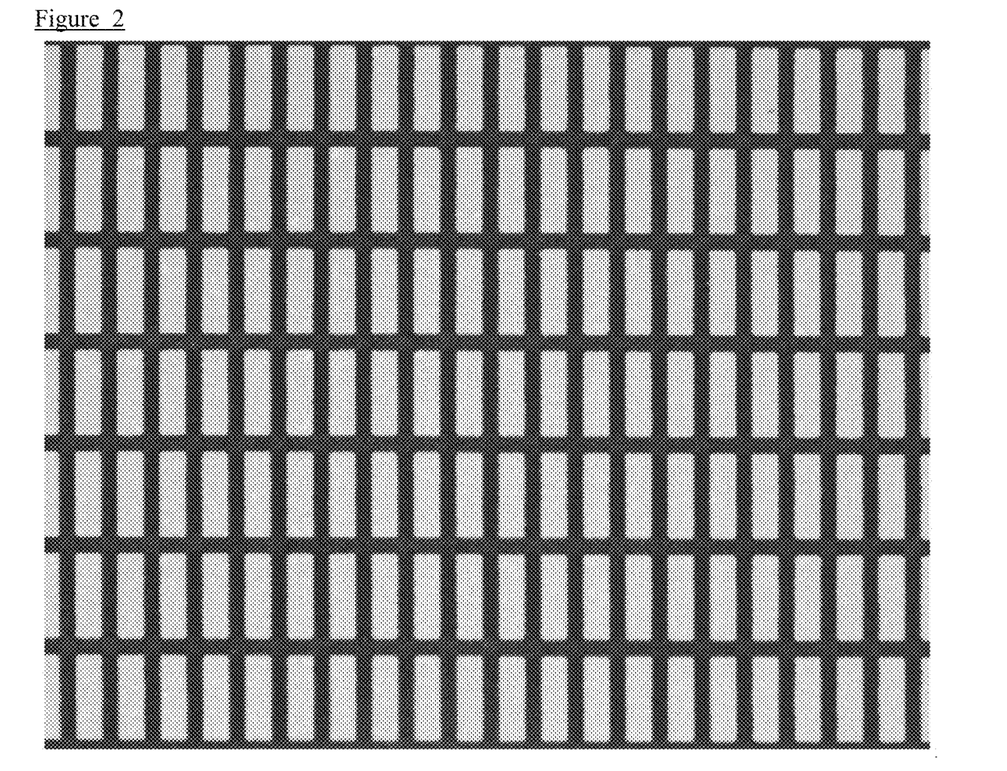
FIG. 2 is an enlarged photograph of a printing pattern on the surface of an air-impermeable substrate printed in each of Example 1 to Example 16.
Figure 3:
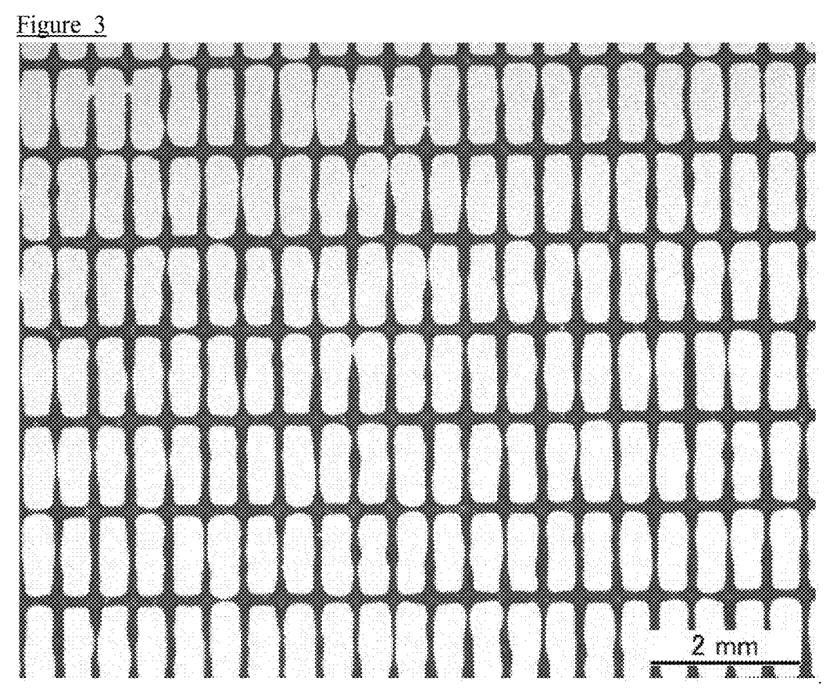
FIG. 3 is an enlarged photograph of a printing pattern on the surface of an air-impermeable substrate printed in Comparative Example 1.
Figure 4:
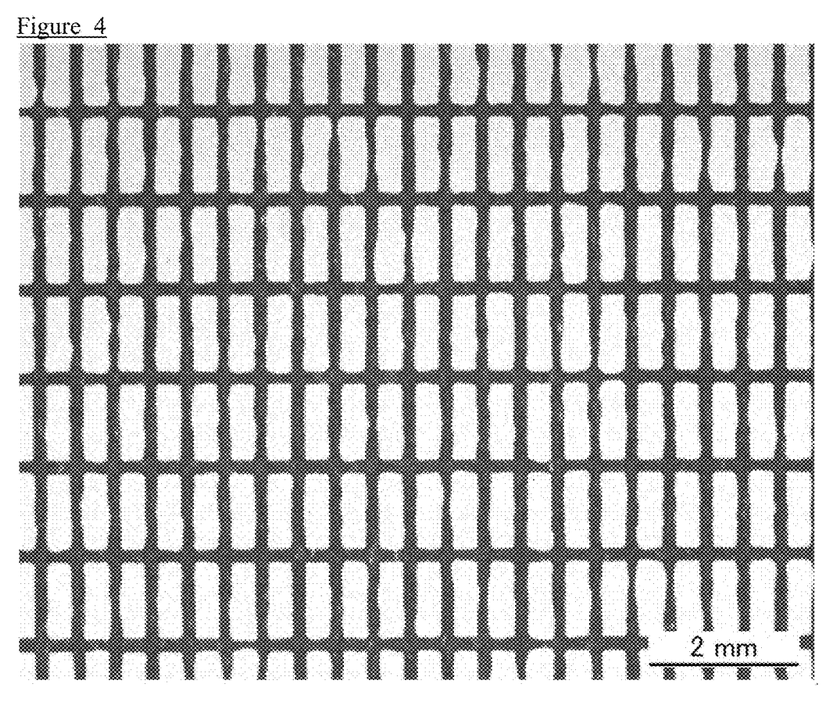
FIG. 4 is an enlarged photograph of a printing pattern on the surface of an air-impermeable substrate printed in Comparative Example 2.

As shown in Table 1 and FIG. 2, in the evaluation samples of Example 1 to Example 11 to which the present invention is applied, it was possible to print an extremely clear ink pattern and thus to classify these samples into the level "○." Regarding the evaluation samples according to these Examples, the fiber diameter of the constituent fibers that are the main components of the non-woven fabric layer is in a range of 0.1 μm to 10.5 μm and the support layer is in a range of 70 to 400 mesh. Among the evaluation samples of these Examples, in Example 3, Example 4, Example 10, and Example 11, a satisfactory printing pattern was obtained by using the support layer to have 200 mesh and adjusting the fiber diameter to a predetermined range. In both Comparative Example 1 (see FIG. 3) and Comparative Example 2 (see FIG. 4) configured by the same support layer as in these Examples, distortion of the printing pattern was recognized. From the comparison of the evaluation results, in order to achieve flatness at the time of printing, it was considered that the fiber diameter of the constituent fibers that are the main components of the non-woven fabric layer to which the present invention is applied needs to particularly have fineness of 10.5 μm or less that is selected in the non-woven fabric D of Example 10.

Figure 5:
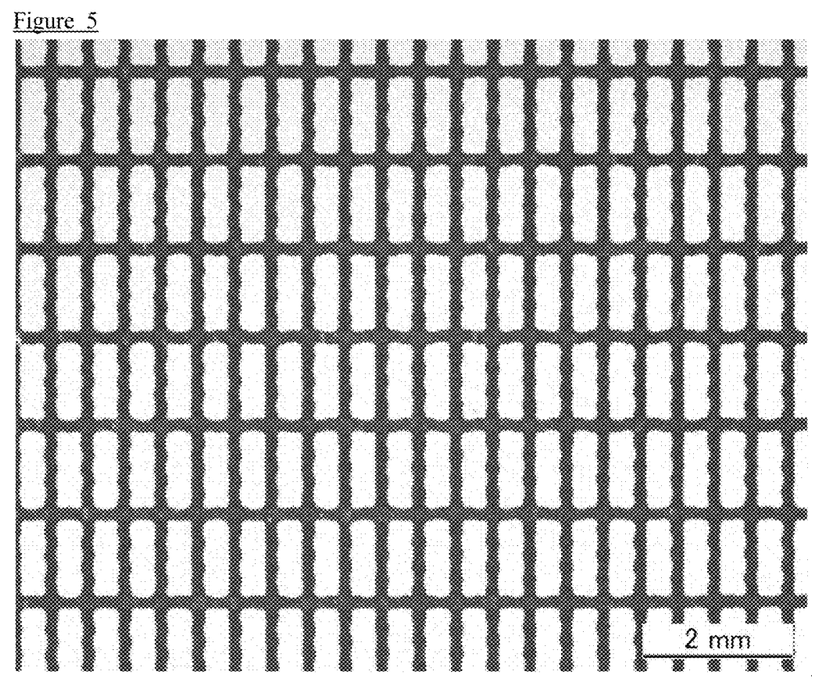
FIG. 5 is an enlarged photograph of a printing pattern on the surface of an air-impermeable substrate printed in Reference Example 1.
Figure 6:
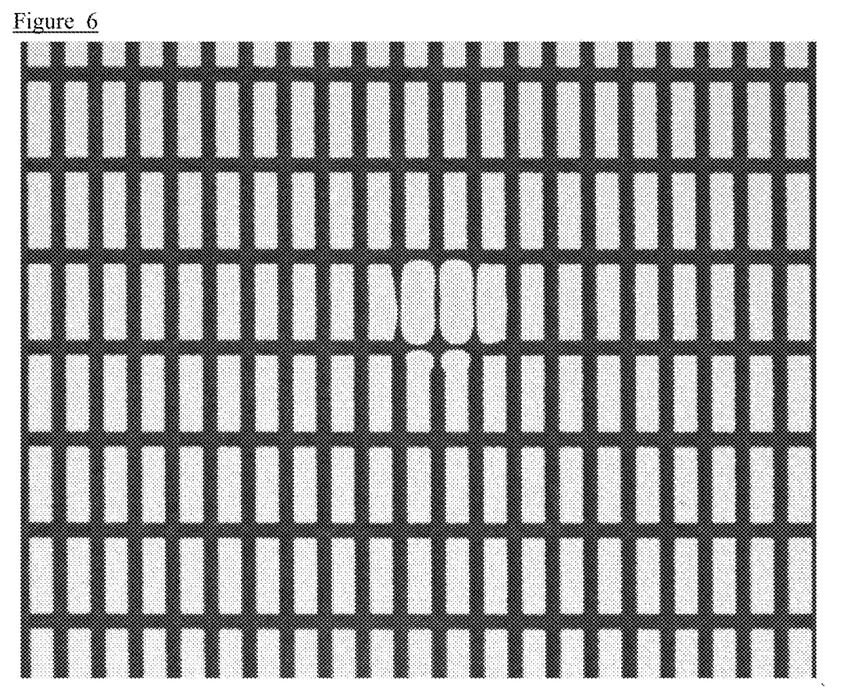
FIG. 6 is an enlarged photograph of a printing pattern on the surface of an air-impermeable substrate printed in Reference Example 2.
Figure 7:
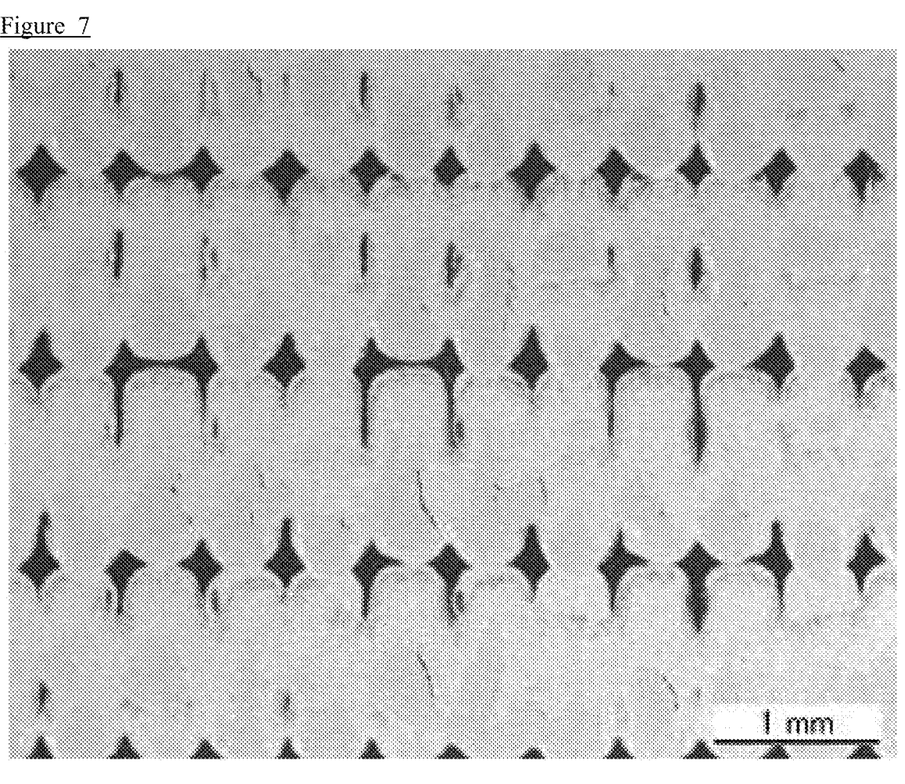
FIG. 7 is an enlarged photograph of a printing pattern on the surface of an air-impermeable substrate printed in Reference Example 3.

Further, in the evaluation sample of Reference Example 1 formed only from the support layer of 200 mesh, as shown in FIG. 5, regular distortion was generated as compared to Comparative Example 1 and Comparative Example 2 not satisfying the above-described condition related to the fiber diameter of the non-woven fabric layer and thus the result of the evaluation sample was classified as "reticulation." In the evaluation sample of Reference Example 2 formed only from the non-woven fabric layer, the pattern of the suction port itself of the suction plate was transferred (see FIG. 6). From these results, it can be understood that a clear printing pattern cannot be obtained even when the fiber diameter is adjusted to a predetermined fineness, and the effects of Examples 1 to 11 are exhibited only by the combination of the support layer and the non-woven fabric layer satisfying a predetermined fiber diameter range.

Furthermore, from the result of Reference Example 3 (see FIG. 7), when printing is performed under the condition that the suction force of the suction port is dispersed in the non-woven fabric layer and then transmitted to the support layer, the pattern of the support layer itself was transferred to a thin film. For this reason, in Reference Example 3 in which the front and rear surfaces of the air-permeable sheet with the same configuration as in Example 2 are inversely used, it was not possible to expect the effect of the present invention.

Moreover, from the results of Example 4 and Example 5, it can be understood that when the support layer has a relatively small opening of 200 to 400 mesh and the fiber diameter is adjusted to about 0.4 μm, the non-woven fabric layer is effective even if the mass per unit area thereof is 5 g/m².

(Preparation Method of Non-Woven Fabric a and Non-Woven Fabric a')

Then, the embodiment of each non-woven fabric layer in which electrostatic charging is prevented will be described as Example according to the extension of the present invention. Further, for understanding of the following description, for example, in the case of the aforementioned "non-woven fabric A" used in Example 1 or the like, in order to clearly describe that a sample is a sample in which a surfactant is added to the non-woven fabric, the alphabet of each name of the non-woven fabrics was changed into a lowercase letter and the sample is described as a non-woven fabric a.

The air-permeable sheet of the present invention is used in a state where the non-woven fabric layer and the support layer are configured to be laminated; however, only the non-woven fabric layer was used as a test object and then test was performed in the following measurement in order to accurately measure the antistatic effect. First, for prevention of electrostatic charging, an anionic surfactant "PELEX SS-H" (manufactured by Kao Corporation: product name; hereinafter, simply described as the surfactant) as a commercially available surfactant was used and the addition thereof was conducted by two means. First, spinning was performed by using a polymer solution blended to the same composition blending as in Example 6, which is described as the aforementioned non-woven fabric A obtained by the electrostatic spinning technique, such that the weight solid content of the surfactant became 2.0 wt % with respect to the weight solid content of polyacrylonitrile in the polymer solution, thereby obtaining the same sample of Example 12 as in Example 6 except that presence and absence of the surfactant addition to the non-woven fabric layer was only different. Incidentally, this Example 12 was obtained by adding a predetermined amount of the surfactant to the sample of the non-woven fabric A, but the mass per unit area of Example was substantially the same as that of Example 6. Then, as a second surfactant addition means, after the aforementioned non-woven fabric A was prepared, an aqueous solution of the surfactant was impregnated and attached with the non-woven fabric and squeezed with a pressure of 0.2 MPa, and drying was then performed with an oven set at 100° C. for 10 minutes, thereby obtaining a sample of Example 13 in which the final amount of the surfactant added is 0.25 wt % with respect to the weight of the non-woven fabric. The sample impregnated and added with the surfactant in this way is described as a non-woven fabric a'.

(Preparation Method of Non-Woven Fabric b and Non-Woven Fabric b')

Then, Example 14 (a non-woven fabric b obtained by addition at the time of spinning) and Example 15 (a non-woven fabric b' subjected to addition through immersion) obtained by subjecting Example 7 to the same antistatic finishing process were prepared. Further, for comparison with Example 11 configured by laminating the non-woven fabric F and the non-woven fabric A, Example 16 provided with the non-woven fabric a' instead of the non-woven fabric A that is exposed on the surface when used as the air-permeable sheet was prepared.

(Electrostatic Charging Evaluation and Printing Evaluation Based on Presence and Absence of Surfactant)

As a measurement evaluation means of an electrostatic charging evaluation sample based on presence and absence of addition of the surfactant, "Frictional Electrostatic Charging Voltage Tester EST-7" (manufactured by Kanebo Engineering Ltd.: product name) was used. The aforementioned "Tetoron Film NS" serving as an air-impermeable substrate was cut into a square with one side of 120 mm to prepare a test object in which both surfaces of the non-woven fabric layer with one side of 100 mm to be provided for the test is covered with the air-impermeable substrate, and neutralization was performed by an antistatic brush in advance. In this state, electrostatic charging was performed in such a condition that the entire surface of the test object was rolled at an equal speed three times while keeping a cylindrical metallic rod with a width of 200 mm and a weight of 1.5 kg close to the test object. Regarding measurement, after the air-impermeable substrate was peeled off from the test object, the non-woven fabric layers or the air-impermeable substrates were measured by the aforementioned test machine. At this time, the measurement was performed in a state where a separation distance between a sample table and an electrostatic voltage sensor was 50 mm. The measurement results thereof are presented in the following Table 2. Incidentally, in Table 2, only the configuration of the non-woven fabric layer in the aforementioned Table 1, presence and absence of the surfactant (described by an addition means and a final solid content weight), and the measurement result of the electrostatic voltage are described.

Further, an air-permeable sheet was prepared by combining each non-woven fabric of Examples 12 to 16 and the aforementioned support layer (metallic mesh) and then evaluation of printing to the air-impermeable substrate was performed on the basis of the aforementioned evaluation means.

TABLE 2

| | Constitution of nonwoven fabric layer | Presence or absence of surfactant | Electrostatic voltage of nonwoven fabric layer (kV) |
|---|---|---|---|
| Example 6 | Nonwoven fabric A | Not added | 3 |
| Example 12 | Nonwoven fabric a | 2.0 wt % in spinning | 0 |
| Example 13 | Nonwoven fabric a' | 0.25 wt % by immersion | 0 |
| Example 7 | Nonwoven fabric B | Not added | 3 |
| Example 14 | Nonwoven fabric b | 2.0 wt % in spinning | 0 |
| Example 15 | Nonwoven fabric b' | 0.25 wt % by immersion | 0 |
| Example 16 | Nonwoven fabric F + Nonwoven fabric a' | 0.25 wt % by immersion only in nonwoven fabric A | 0 |

(Evaluation Result)

As also understood from Table 2, in five evaluation samples of Example 12 to Example 16 added with a surfactant, the electrostatic voltage of the non-woven fabric layer is 0 kV and thus it is confirmed that the electrostatic charging is evidently suppressed as compared to Example 6 and Example 7 each serving as a comparison target. Further, although the electrostatic charging measurement result of the air-impermeable substrate is not described in Table 2, when the electrostatic voltage of each non-woven fabric layer coming in contact with the air-impermeable substrate at the time of actual use is 0 kV, the electrostatic voltage at the substrate side was also substantially 0 kV. Furthermore, in a series of samples, even when the adhesion amount of the surfactant added at the time of spinning or after immersion and drying is increased up to 5 wt %, the antistatic effect was the same as in the above-described test result. In addition, when test is conducted on the non-woven fabric D (corresponding to Example 9) prepared by a wet method, the electrostatic voltage of the non-woven fabric layer was substantially 0 kV. From the result of the non-woven fabric D, the reason for this is considered that the surfactant used for dispersing fibers in a wet method is effective in the prevention of electrostatic charging.

Moreover, also regarding any of Example 12 to Example 16, the printing pattern shown in FIG. 2, that is, a clear ink pattern was printed in observation with a microscope.

INDUSTRIAL APPLICABILITY

Provided is an air-permeable sheet to be used in a state of being interposed between a flat suction stage and an air-impermeable substrate when printing is performed on the surface of the air-impermeable substrate fixed by suction to the suction stage, and it is possible to form a desired printing pattern on the surface of the substrate.

Hereinbefore, the present invention has been described according to specific embodiments, but various changes and modifications obvious to those skilled in the art are possible without departing from the scope of the appended claims.

EXPLANATIONS OF LETTERS OR NUMERALS

1 . . . suction stage, 2 . . . suction port,
3 . . . air-permeable sheet, 3$a$ . . . support layer, 3$b$ . . . non-woven fabric layer,
4 . . . air-impermeable substrate, 5 . . . ink applying member.

The invention claimed is:

1. An air-permeable sheet to be used in a state of being interposed between a flat suction stage and an air-impermeable substrate when printing is performed on the surface of the air-impermeable substrate fixed by suction onto the suction stage, the air-permeable sheet comprising:
a non-woven fabric layer being in contact with the air-impermeable substrate; and
a support layer being in contact with the suction stage and formed from a woven fabric or knitted fabric.

2. The air-permeable sheet according to claim 1, wherein the support layer has an opening of 70 to 400 mesh.

3. The air-permeable sheet according to claim 1, wherein the non-woven fabric layer being in contact with the air-impermeable substrate is mainly formed from constituent fibers having a fiber diameter of 10.5 µm or less.

4. The air-permeable sheet according to claim 2, wherein the non-woven fabric layer being in contact with the air-impermeable substrate is mainly formed from constituent fibers having a fiber diameter of 10.5 µm or less.

5. The air-permeable sheet according to claim 3, wherein the non-woven fabric layer comprises conductive fibers or a surfactant.

6. The air-permeable sheet according to claim 4, wherein the non-woven fabric layer comprises conductive fibers or a surfactant.

* * * * *